United States Patent
Atherton

[11] Patent Number: 6,157,184
[45] Date of Patent: Dec. 5, 2000

[54] INSULATED ELECTROSTATIC VOLTAGE INDICATOR

[76] Inventor: John C. Atherton, 2985 NW. Luray Ter., Portland, Oreg. 97210

[21] Appl. No.: 08/990,102

[22] Filed: Dec. 12, 1997

[51] Int. Cl.[7] .................................................. G01R 19/16
[52] U.S. Cl. ........................................... 324/133; 324/126
[58] Field of Search .................................... 324/133, 109, 324/770, 126

[56] References Cited

U.S. PATENT DOCUMENTS

| | | | |
|---|---|---|---|
| 2,091,521 | 8/1937 | Pattison | .................................... 324/109 |
| 2,449,150 | 9/1948 | Schnoll . | |
| 4,829,289 | 5/1989 | Kallman et al. . | |
| 5,070,301 | 12/1991 | Schweitzer, Jr. . | |
| 5,077,520 | 12/1991 | Schweitzer, Jr. . | |
| 5,095,265 | 3/1992 | Schweitzer, Jr. . | |
| 5,150,058 | 9/1992 | Johnson . | |
| 5,274,324 | 12/1993 | Schweitzer, Jr. . | |
| 5,363,088 | 11/1994 | Schweitzer, Jr. . | |
| 5,424,630 | 6/1995 | Vazquez . | |
| 5,428,288 | 6/1995 | Foreman et al. . | |

FOREIGN PATENT DOCUMENTS

| | | |
|---|---|---|
| 474305 | 6/1951 | Canada . |
| 728300 | 2/1966 | Canada . |
| 993952 | 7/1976 | Canada . |
| 221666 | 6/1942 | Switzerland . |

*Primary Examiner*—Safet Metjahic
*Assistant Examiner*—Jose M. Solis

[57] ABSTRACT

An indicator for mounting on a power cord (FIG. 3) for almost instantaneously indicating the presence or absence of a single-phase AC voltage potential on a monitored power cord for a grounded AC power distribution system. The indicator comprises a housing (16, 18, 20, 26), an electronic display (10), a static suppression resistor (12), a first conductive element (14) in physical proximity to the monitored power cord, and a second conductive element (22) meant to be touched by a human being to provide a visual indication on the electronic display (10) of the presence or absence of a voltage potential on the monitored conductor or power cord. The hot conductor being part of a power cord is capacitively coupled (FIG. 1) to an electronic display (10) in parallel with a static suppression resistor (12). A current flow due to the capacitive coupling between the hot conductor and first conductive element (14) causes a voltage drop across the display (10) and the resistor (12). This voltage drop energizes the electronic display (10). The current flow from the display (10) and the resistor (12) merge together to return to ground through a human being touching a second conductive element (22). The path of current flow is completed by the power source ground connection. The indicator is electrically insulated from the power cord it monitors due to the insulation on the power cord at the location of the indicator.

18 Claims, 5 Drawing Sheets

INSULATED ELECTROSTATIC VOLTAGE INDICATOR

BACKGROUND-FIELD OF THE INVENTION

The indicator presented is intended for single-phase AC voltage detection on 90–130 volt rms line cords, and nonmetallic-sheathed cable used in grounded AC power distribution systems.

BACKGROUND-DESCRIPTION OF PRIOR ART

Consumers of electric power have long been inconvenienced with the problem of determining whether there is electric power going to an appliance or device that they're about to use. Traditionally they just switch the appliance or device on to see if it works. Not all appliances can be determined to be operable at the moment the power switch is turned on. Examples of this are coffee makers, soldering irons, and clothes irons that don't have visual power indicators. The failure or unknown question of whether an appliance or device is instantaneously working leads to the natural question; "Is there power going to the appliance or device?" It is the intent of this invention to provide a simple and almost instantaneous answer to this question. Although the present invention doesn't represent a necessity in many applications, it does represent a convenience to expedite the troubleshooting process. The purpose of this invention is to provide a simple, convenient, and almost instantaneous indication of whether there's an AC single-phase voltage potential present on a nonmetallic-sheathed cable, or an AC line cord, but first a discussion of the prior art.

U.S. Pat. No. 5,424,630 to Vazquez (1995) is for a voltage indicator that has a knife blade as one electrical contact and an alligator clip as the other electrical contact of the voltage indicator. The two disadvantages of this indicator are readily apparent. The knife blade contact is used to cut through the insulation on the wire thus permanently damaging it, and the alligator clip needs an electrical terminal to be clipped on to complete the circuit.

U.S. Pat. No. 5,428,288 to Foreman et al. (1995) and U.S. Pat. No. 2,449,150 to Schnoll (1948) are for related indicators. In both of these patents a thin electrical connecting wafer is slid over the male end of a standard electric power plug. A common disadvantage of both of these inventions is that the thin wafer decreases the quality of the electrical connection of the male plug to the power receptacle. The Foreman et al. patent also requires the use of a computer to sense a power failure while in the Schnoll patent the indicator can only be read at the male power plug and not at anywhere along the length of the power cord as with the present invention.

U.S. Pat. No. 4,829,289 to Kallman et al. (1989) and Canadian patent 728,300 to Windsor (1966) are for related indicators. The patents are for an illuminated plug that goes between the power receptacle and the male end of the power cord plug. Both of these devices have the disadvantage of only being usable at a power receptacle which may be behind a piece of furniture. In the Windsor patent the appliance or device connected to the plug has the additional disadvantage of needing to be turned on in order for the path through the illuminated indicator to be complete.

Swiss patent 221,666 to Gerber (1942) and Canadian patent 474,305 to Simmons (1951) are for related indicators. These two patents are for a screwdriver or pen type of voltage indicator that uses a return path to ground for the indicator circuit through a human being. While the method of using a human as the return path to ground is the same ground return method as in the present invention, the two patents have the disadvantage of needing to make physical contact between the indicators probe tip and the conductors metal under test. The present invention only requires that the indicator be in physical proximity to a power cord under test with no metal to metal contact between the conductors of the conductor or power cord and the indicator electrodes.

Canadian patent 993,952 to Friesen (1976) is for a power cord voltage indicator in which metallic contacts pierce the conductors of the power cord under test. The piercing of the power cord conductors has the disadvantage of doing permanent damage to the power cord insulation as well as the disadvantage of being unusable on power cords that are completely enclosed in an outer sheath.

U.S. Pat. No. 5,095,265 to Schweitzer Jr. (1992) is for a coaxial power cord voltage indicator in which the capacitive sensor must pierce through the outer conductive jacket of the coaxial cable in order to be operative. The patent is limited in use to only coaxial cables in which the outer sheath is electrically conductive due to the need to provide a ground return path. The present invention is usable without piercing the power cord, and it's not usable on coaxial cables. Other patents to Schweitzer Jr. for related devices are U.S. Pat. No. 5,077,520 (1991), U.S. Pat. No. 5,363,088 (1994), and U.S. Pat. No. 5,070,301 (1991). These are all for coaxial cables with a ground return on the outer coaxial conductor. The present invention uses a human ground return.

REASONS FOR UTILITY OF INVENTION

1. Device can be physically mounted anywhere on single hot conductor or line cord.
2. Device doesn't physically damage single hot conductor or line cord.
3. Circuit breaker or fuse may be tripped or blown at main panel.
4. Incandescent light bulb filament may be burned out.
5. Ground fault circuit interrupter may be tripped.
6. Receptacle may be controlled by a light switch.
7. The plug in point is at a remote location.
8. The appliance may be burned out or defective.
9. The power cord may have been accidentally yanked from receptacle.
10. Appliance may contain a heating or cooling element that would take several minutes to know if turned on.
11. Catastrophic failure fuse may be blown in appliance.

OBJECTS AND ADVANTAGES

While power cords, and nonmetallic-sheathed cable have long existed without a convenient and inherently simple power indication means, it is an object and advantage of this invention to provide a convenient and simple indicator for the electric power consumer. Applications of the invention are shown in FIGS. 3A to 3D. In FIG. 3A the invention is used at the female end of an extension cord to determine if the male end is plugged in at a remote location. In FIG. 3B the invention is used to determine if a light bulb is burned out or if the lamp is plugged into a switched receptacle. In FIG. 3C the invention is used to determine if the heating element in the soldering iron is working. In FIG. 3D the invention is used to test whether a circuit breaker is tripped or the GFCI defective. Two advantages of this voltage indicator are; it can be placed anywhere on the line cord, not just at the ends and it doesn't physically damage the line cord insulation.

DRAWING FIGURES

FIG. 6A is an end view of the top metal housing.

Reference Numbers in Drawings

10 Liquid Crystal Display (1)
11 "Lightning Bolt" Symbol on LCD Display
12 Static Suppression Resistor (1)
14 First Conductive Element Foam Pads (2)
16 Top Phenolic Insulating Layer (1)
18 Bottom Phenolic Insulating Layer (1)
20 Top Metal Housing (1)
22 Second Conductive Element (1)
24 Heat Shrinkable Tubing Sleeve (1)
26 Bottom Metal Housing (1)
28 Non-Conductive Epoxy Glue (3)
30 Through Holes (4)
32 Tapped Holes (2)
34 Metal Contact Element (1)
36 Machine Screws (2)
38 Terminal Lugs (2)
40 Solder Connection (3)
42 Non-Conductive Enamel (2)

Figure 3:
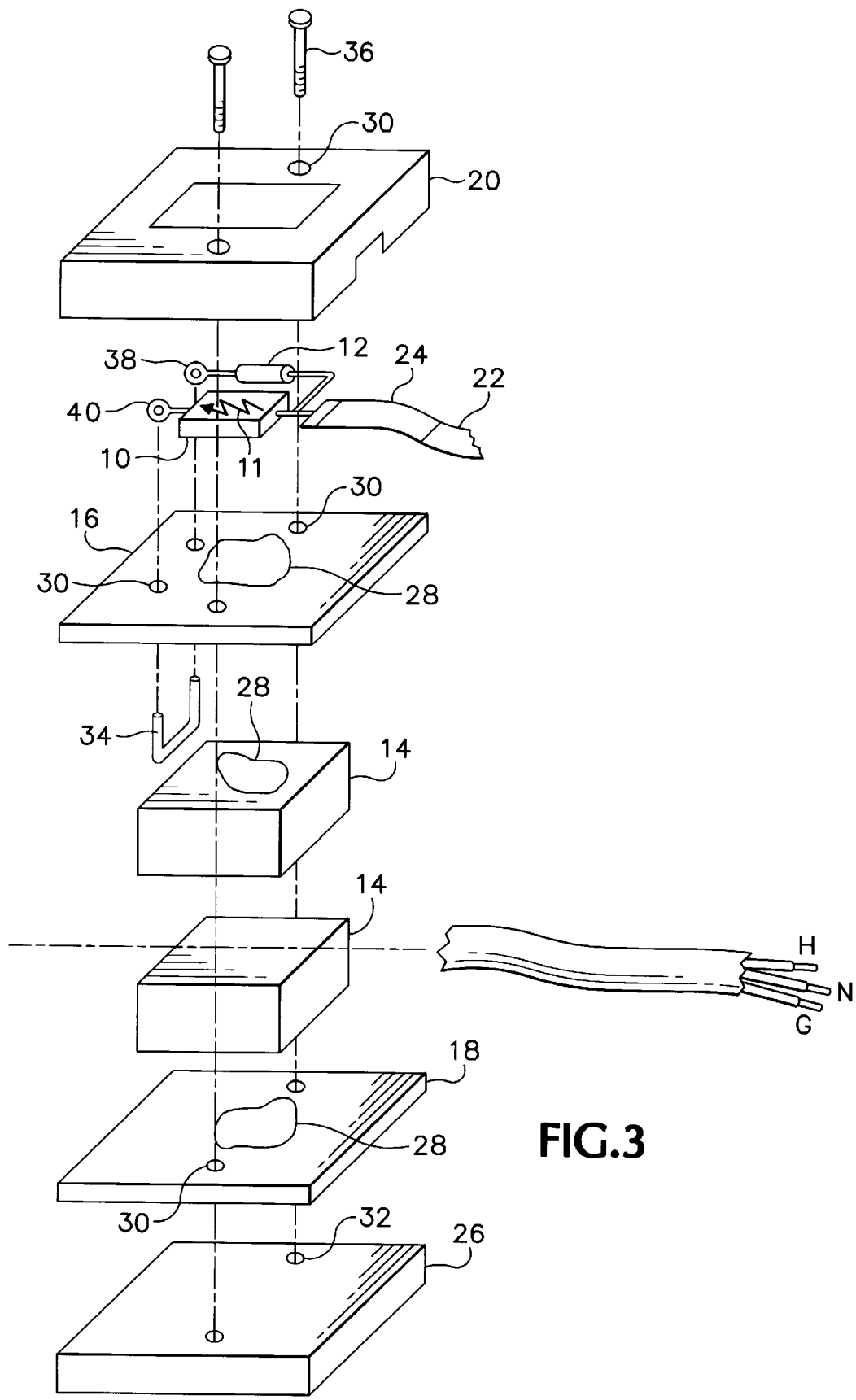
FIG. 3 is an exploded perspective view of an assembly of the indicator.

Description—FIGS. 3, 4, 5, 6,

FIG. 3 shows a perspective assembly view of an indicator which is composed of a sandwich of elements held together by two screws 36. In large production volumes a top metal housing 20 can be stamped on a punch press or made of a die casting. In smaller production volumes the housing 20 can be machined on a CNC machining center. The preferred material for the housing 20 is stainless steel or aluminum.

FIG. 3 shows a liquid crystal display 10 that is a two lead device with a "lightning bolt" symbol 11 that is turned on and off by the presence and absence respectively of AC potential voltage in the monitored conductors when a human touches a second conductive element 22. Two solder joints 40 connect the ring terminals 38 to a metal contact element 34. These solder connections 40 also complete a parallel connection between the liquid crystal display 10 and static suppression resistor 12. A solder joint also connects the touchable second conductive element 22 to display 10 and resistor 12. The second conductive element 22 is made of finely braided copper wire. A sleeve of heat shrink tubing 24 insulates element 22 from housing 20.

The display 10 and the resistor 12 are attached to a top phenolic insulating layer 16 by means of a clear pad of non-conductive epoxy glue 28. Two first conductive element foam pads 14 are used in the indicator. The conductive foam pads 14 are material that is used for the static sensitive storage of integrated circuits. The conductive foam pads 14 are epoxy glued 28 to the top phenolic insulating layer 16 and a bottom phenolic insulating layer 18. The metal contact element 34 is physically touching the top conductive foam pad 14. The two pads 14 make electrical contact with each other on either side of a monitored power cord due to the compression provided by the two screws 36. The top insulating layer 16 and the bottom insulating layer 18 are made of printed circuit board substrate. Through holes 30 designate clearance holes for the machine screws 36 or metal contact element 34 are drilled completely through the material. A bottom metal housing 26 has two tapped holes 32 in it to accommodate the machine screws 36. The preferred material for the bottom metal housing 26 is stainless steel or aluminum.

Figure 4:
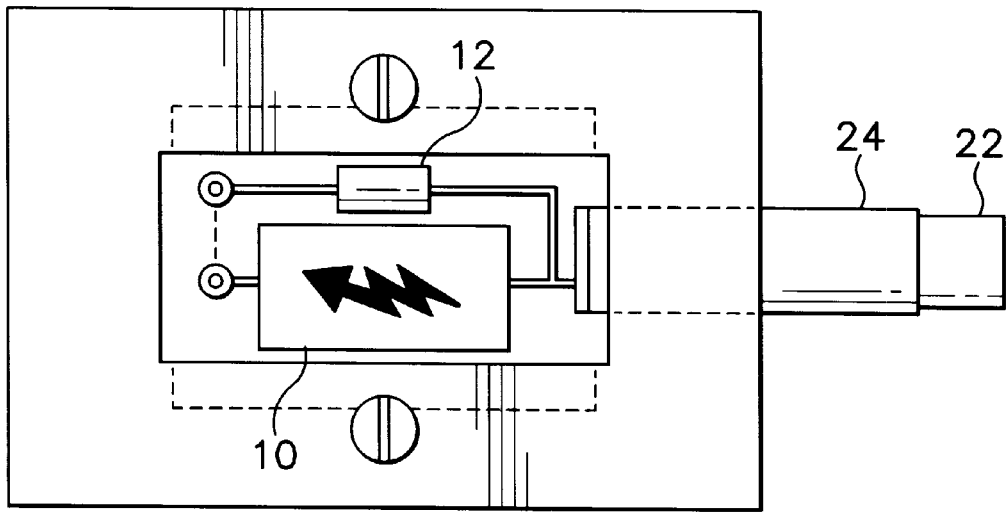
FIG. 4 is a top view of the indicator.
Figure 5:
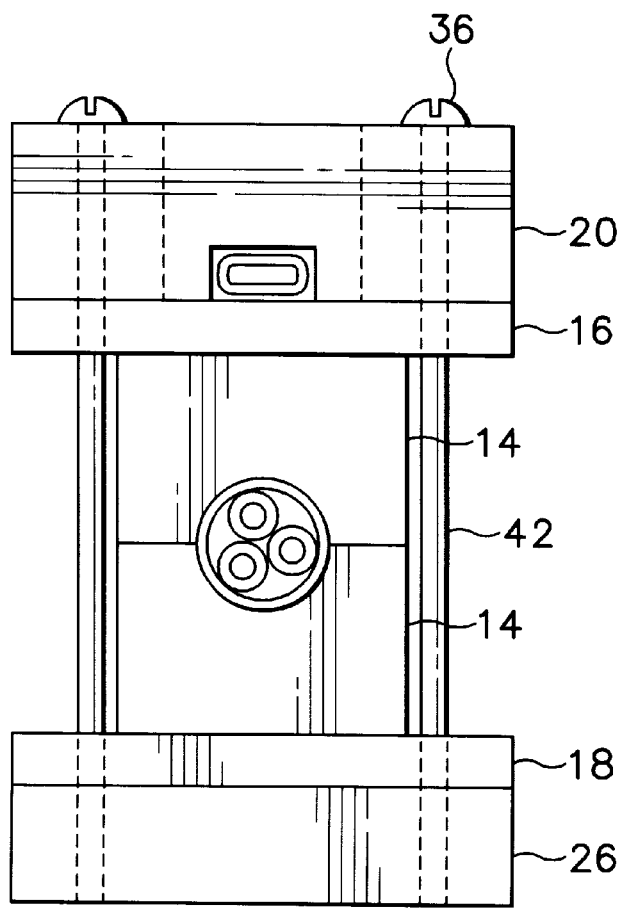
FIG. 5 is an elevation view of a power cord or nonmetallic-sheathed cable surrounded by the indicator before screw compression of conductive foam pads.

In FIG. 5 the hot conductor doesn't have to have any special orientation with respect to the indicator as long as the cord containing the hot conductors axis is widthwise down the center of the housing 20 as shown by the horizontal center line in FIG. 4. In FIG. 6 an electrical insulating enamel 42 is put on the shaft of screws 36 to prevent an electrical connection between the first conductive element foam pads 14 and the indicators metal housing 20.

Figure 6A:
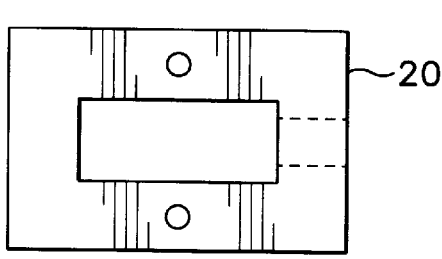
FIG. 6A is a top view of a top metal housing.
Figure 6B:
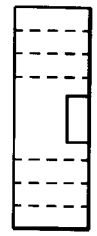
FIG. 6C is a bottom view of the top metal housing.
FIG. 6D is a top view of a top phenolic insulating layer.
FIG. 6E is a top view of a first conductive element foam pad.
FIG. 6F is an end view of the first conductive element foam pad.
FIG. 6G is a top view of a bottom phenolic insulating layer.
FIG. 6H is a top view of a tapped bottom metal housing.
Figure 6C:
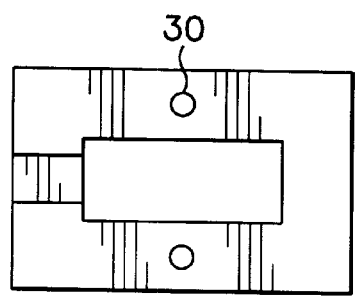
Figure 6D:
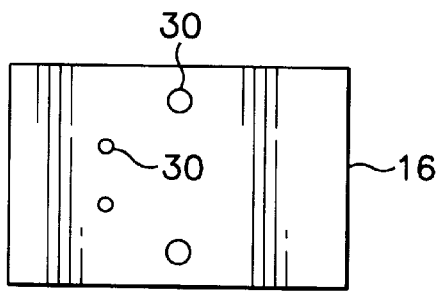
Figure 6E:
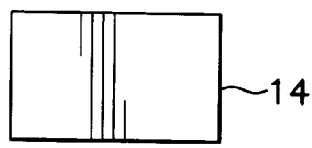
Figure 6F:
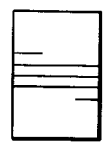
Figure 6G:
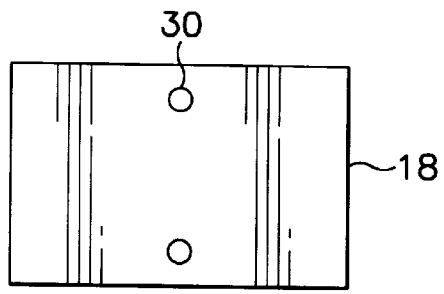
Figure 6H:
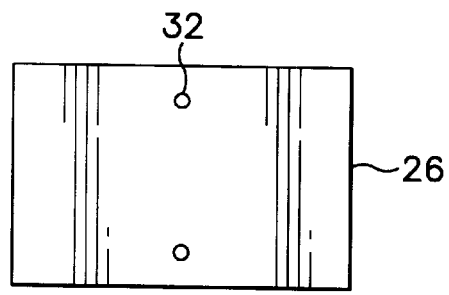

In FIG. 6D the slot represented by the hidden object line is dimensioned to accommodate element 22 with heat shrink tubing sleeve 24 around the element 22.

In FIG. 6D the two through holes 30 for metal contact element 34 are in the interior of the window in housing 20.

Figure 1:
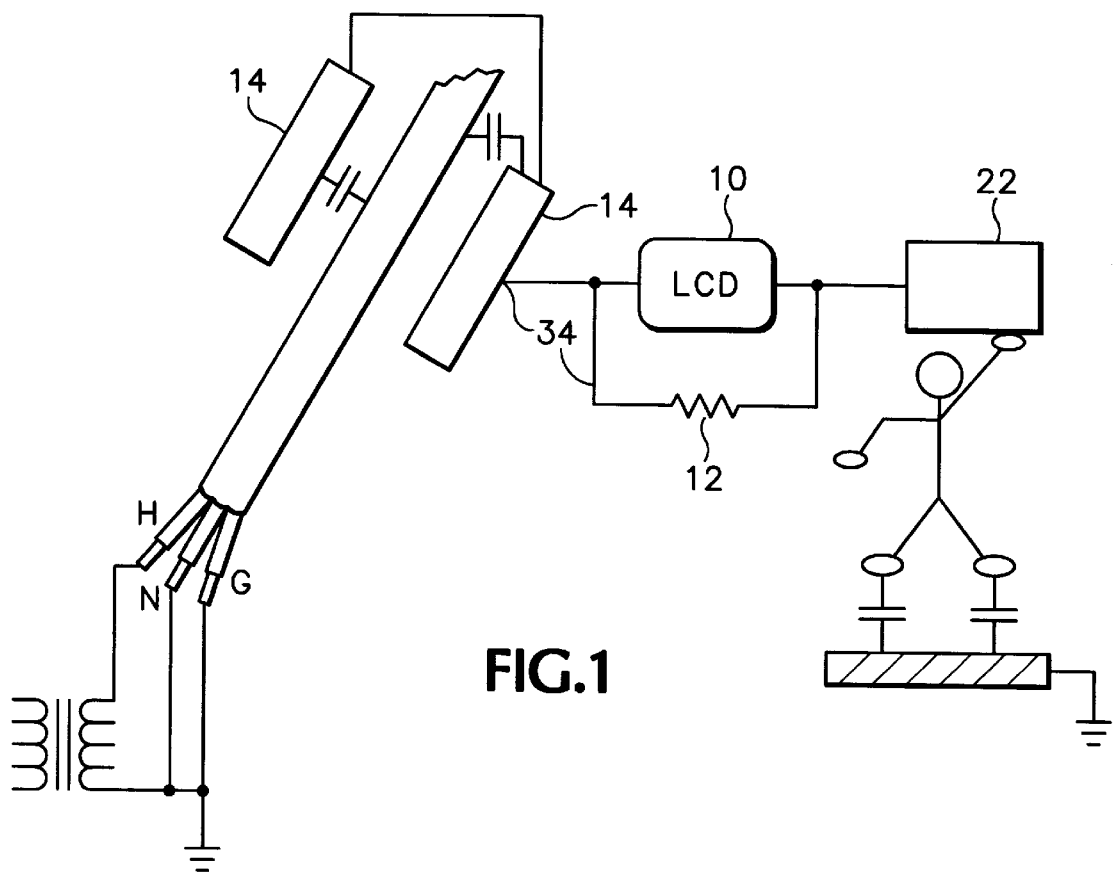
FIG. 1 is a schematic diagram of the indicator monitoring a grounded power cord or nonmetallic-sheathed cable.
Figure 2A:
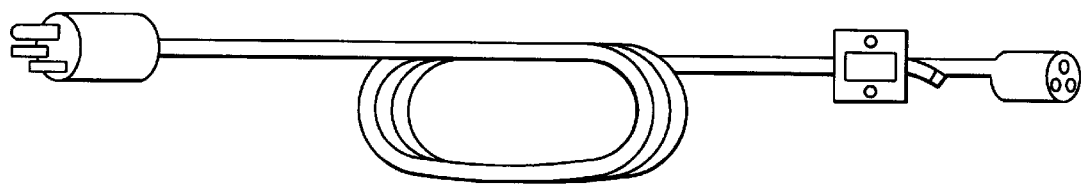
FIGS. 2A to 2B are applications of the indicator.
Figure 2B:
Figure 2C:
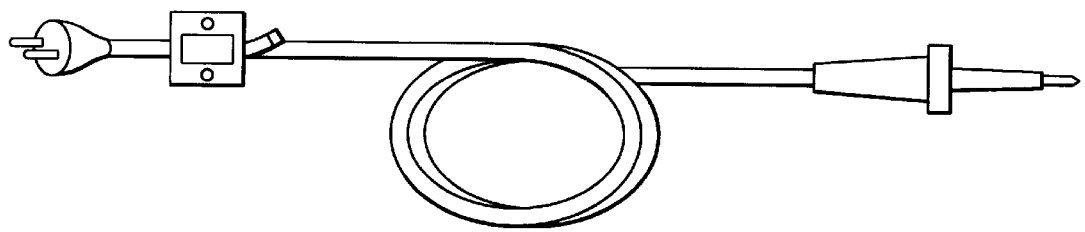
Figure 2D:
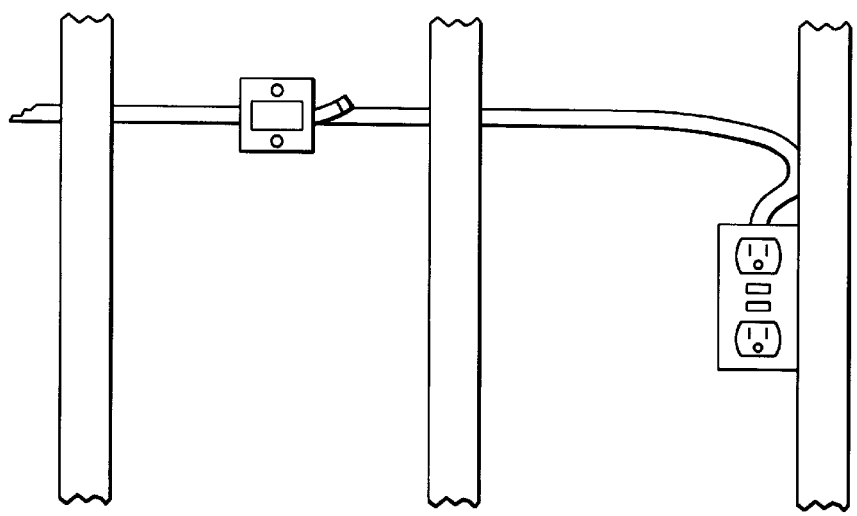

Operation FIG. 1

FIG. 1 is a schematic diagram of a voltage indicator monitoring a power cord including a hot conductor H, a grounding (green) conductor G and a neutral conductor N. In FIG. 1 the current flow actuating the indicator forms a closed loop when a human touches the second conductive element 22 when the monitored conductor is electrically energized. The current flow starting at the hot lead of the step-down transformer secondary flows through the monitored conductor to an area where it is capacitively coupled to the first conductive element foam pads 14 which conform to the shape of the conductor or cord it surrounds. The current flow then divides itself between the liquid crystal display 10 and the static suppression resistor 12. The current flow produces a voltage across the liquid crystal display 10 which actuates the "lightning bolt" symbol 11 on the display 10. The current flow recombines from the liquid crystal display 10 and the static suppression resistor 12 since the two components are in parallel. The recombined current then flows into a human touching second conductive element 22. The current into the human is capacitively coupled to ground via the persons body. The current through ground then returns to the other secondary lead of the transformer through the transformers ground connection thus completing the circuit.

The static suppression resistor 12 prevents a static charge on the human being from falsely actuating the liquid crystal display 10 when there's no voltage present on the monitored conductor or cord. The operating voltage of the liquid crystal display 10 in the preferred embodiment is 2.0 volts minimum. The static suppression resistor 12 has a predetermined value of 22 megaohms.

Summary, Ramifications, and Scope

Accordingly, the reader will see that the insulated electrostatic voltage indicator of this patent application provides a convenient and inherently simple method for the determination of an AC voltage potential on a line cord, or a nonmetallic-sheathed cable. A summary of reasons for the usefulness of this invention was included in the "Reasons for Utility of This Invention" section.

Possible ramifications of this invention include but are not limited to making the housing in the form of a pliers so that a testing tool can be made that temporarily and momentarily is placed on a power cord to test for the presence of voltage with respect to ground. The housing for the indicator doesn't necessarily need to be made out of metal. It could be molded plastic. The housing could be made in the form of a hinged device also. Although the description above contains certain specificities, these should not be construed as limiting the scope of the invention but as merely providing illustrations of the currently preferred embodiment.

Thus the scope of the invention should be determined by the appended claims and their legal equivalents, rather than by the example given.

I claim:

1. An AC voltage indicator for mounting on a power cord including an insulated hot conductor for indicating the presence or absence of voltage on a power cord connected to a grounded AC power distribution system comprising:

a housing for mounting on said power cord, status indicating means comprising a high impedance display device having at least a first and second display electrode connected in parallel with a static suppression resistor, the status indicating means being located in the housing;

a first conductive element in physical proximity to, and electrically insulated from, said power cord, said first conductive element being connected to said first electrode of said display device; and a second conductive element exposed for touching by a human being and that is connected to said second electrode of said display device;

whereby the presence or absence of voltage on the insulated hot conductor of the power cord is indicated by a change in the appearance of said display device when said second conductive element is connected to ground through a human being, and wherein said housing is detachable from the power cord.

2. The indicator of claim 1 wherein the said display device is a liquid crystal display with a minimum operating voltage of 2.0 volts.

3. The indicator of claim 1 wherein said resistor has a resistance value of 22 megaohms.

4. The indicator of claim 1 wherein said housing is made of plastic and streamlined.

5. The indicator of claim 1 wherein said display device has a "lightning bolt" indication on it when electrically energized.

6. The indicator of claim 1 wherein said display device has the words "Power On" on it when electrically energized.

7. The indicator of claim 1 wherein the said housing is a hinged housing that closes around the power cord.

8. The indicator of claim 1 wherein the said housing is in the form of a pliers for closing around the power cord.

9. A method of determining the presence or absence of an electrical potential voltage on a power cord including an insulated hot conductor, said method comprising:

providing an AC voltage indicator for mounting on the power cord comprising a housing for mounting on the power cord; status indicating means comprising a high impedance display device having at least a first and a second display electrode connected in parallel with a static suppression resistor; a first conductive element in physical proximity to, and electrically insulated from, said power cord, said first conductive element being connected to said first electrode of said display device; and a second conductive element that is connected to said second electrode of said display device;

capacitively coupling said second conductive element to ground;

viewing said status indicating means to determine the status indicating display appearance, and wherein the housing is detachable from the power cord and the status indicating means is located in the housing.

10. The method of claim 9 wherein the said display device is a liquid crystal display with a minimum operating voltage of 2.0 volts.

11. The method of claim 9 wherein said resistor has a resistance value of 22 megaohms.

12. The method of claim 9 wherein said housing is made of plastic and streamlined.

13. The method of claim 9 wherein said display device has a "lightning bolt" indication on it when electrically energized.

14. The method of claim 9 wherein said display device has the words "Power On" on it when electrically energized.

15. The method of claim 9 wherein the said housing is a hinged housing that closes around the power cord.

16. The method of claim 9 wherein the said housing is in the form of a pliers for closing around the power cord.

17. The indicator of claim 1 wherein the first conductive element is a body of conductive foam material which is compressed in the housing.

18. The indicator of claim 1 wherein the housing includes first and second parts and a mechanism for urging the first and second parts together and the first conductive element is a body of conductive foam material which is compressed in the housing.

* * * * *